(12) United States Patent
Okano et al.

(10) Patent No.: US 6,876,013 B2
(45) Date of Patent: Apr. 5, 2005

(54) COMPOUND SEMICONDUCTOR MULTILAYER STRUCTURE AND BIPOLAR TRANSISTOR USING THE SAME

(75) Inventors: Taichi Okano, Chichibu (JP); Takashi Udagawa, Chichibu (JP)

(73) Assignee: Showa Denko K.K., Tokyo (JP)

( * ) Notice: Subject to any disclaimer, the term of this patent is extended or adjusted under 35 U.S.C. 154(b) by 57 days.

(21) Appl. No.: 10/363,315

(22) PCT Filed: Aug. 31, 2001

(86) PCT No.: PCT/JP01/07536

§ 371 (c)(1),
(2), (4) Date: Mar. 3, 2003

(87) PCT Pub. No.: WO02/21599

PCT Pub. Date: Mar. 14, 2002

(65) Prior Publication Data

US 2003/0183816 A1 Oct. 2, 2003

Related U.S. Application Data

(60) Provisional application No. 60/237,730, filed on Oct. 5, 2000, and provisional application No. 60/254,897, filed on Dec. 13, 2000.

(30) Foreign Application Priority Data

Sep. 8, 2000 (JP) ........................................ 2000-272840
Nov. 29, 2000 (JP) ........................................ 2000-362534

(51) Int. Cl.$^7$ ............................................ H01L 29/737
(52) U.S. Cl. ........................................ 257/198; 257/197
(58) Field of Search ................................. 257/197, 198

(56) References Cited

U.S. PATENT DOCUMENTS 5,814,843 A 9/1998 Ohkubo
6,096,617 A 8/2000 Kizuki

FOREIGN PATENT DOCUMENTS

JP 9-205101 A 12/1997

OTHER PUBLICATIONS

N. Aihara et al., "Atmospheric–Pressure MOVPE Growth and Characterization of High–Quality Carbon–Doped GaAs". European Workshop on Metalorganic Vapour Phase Epitaxy IV. Nijemegen, the Netherlands, Jun. 5–7 1991.
B. Yeats et al., "Reliability of InGaP–Emitter HBTs", Digest of Papers. GaAs MANTECH Conference, Washington, D.C. pp. 131–135, May 1–4, 2000.
K. Uchida et al., "104 and 134 GHz InGaP/InGaAs HBT Oscillators", IEEE Gallium Arsenide Integrated Circuit Symposium. Technical Digest 1999, pp. 237–240, Monterey, CA. Oct. 17–20, 1999.
G. Martinelli, "Crystalline Silicon For Solar Cells", Solid State Phenomena, vol. 32–33 (1993) pp. 21–26.

(Continued)

Primary Examiner—Bradley Baumeister
(74) Attorney, Agent, or Firm—Sughrue Mion, PLLC

(57) ABSTRACT

A compound semiconductor multilayer structure comprising a carbon-containing p-type gallium arsenide (GaAs)-system crystal layer, wherein the carbon-containing p-type GaAs-system crystal layer exhibits a predominant photoluminescence peak measured at 20K within a range of 828 nm to 845 nm, and wherein the ratio of hydrogen atom concentration to carbon atom concentration in the carbon-containing p-type GaAs crystal layer is 1/5 or less. Furthermore, in a photoluminescence measurement at 10K, the carbon-containing GaAs-system p-type crystal layer exhibits a first predominant photoluminescence peak and a second predominant photoluminescence peak due to band gap transitions of GaAs and wherein the second predominant luminescence wavelength has a longer wavelength than the first predominant photoluminescence wavelength and the intensity ratio of the second luminescence peak to the first luminescence peak is within a range from 0.5 to 3.

22 Claims, 5 Drawing Sheets

OTHER PUBLICATIONS

T. Ahmad et al., "Effect of Base Dopants on the Bias Stress Stability of AlGAAS/GaAs HBTs," Electronics Letters, IEE Stevenage, GB, vol. 29, No. 19, Sep. 17, 1993 pp. 1725–1726, XPP000397023.

Stockman: "Effect of Post–Growth Vcooling Ambient on Acceptor Passivation in Carbon–doped GaAs Grown By Metalorganic Chemical Vapor Deposition." Applied Physics Letters,vol. 62, No. 11, 15 Mar. 1993, pp. 1248–1250, XP000749266.

Isamu Akazaki et al., III–VZoku Kagobutu Handotai (III–V group compound semiconductors). Haifukan Co., May 20, 1994, first edition pp. 239–242.

Handotai Kogaku (Semiconductor Technology) edited by Toyoshi Fukami, Tokyo Denki Daigaku Shuppan Kyoku, published on Mar. 20, 1993, pp. 97–99.

IEEE 21st Annual GaAs IC Symposium (Oct. 17–20. 1999), K. Uchida et al., "104 and 134 GHz InGaP/InGaAs HBT Oscillators", pp. 237–240.

Abstract of Fourth European Workshop on Metalorganic Vapor Phase Epitaxy in English (Jun. 5–7, 1991, Nijmegen, The Netherlands), N. Aihara et al., "Atmospheric–Pressure MOVPE Growth and Characterization of High Quality Carbon–Doped GaAs".

2000 GaAs Mantech conference, USA, May 1–4, 2000, B. Yeats et al., "Reliability of InGaP–Emitter HBTs", pp. 131–135.

Sejiro Furukawa et al., Denshi Debaisu Kogaku (Electronic Device Technology), Moritaka Shuppan K.K. published on Oct. 16, 1995.

Kagaku Binran Kisohen (Chemistry Handbook, Basic Part) edited by the Chemical Society of Japan , Maruzen K.K., 1970, p. 1259).

COMPOUND SEMICONDUCTOR MULTILAYER STRUCTURE AND BIPOLAR TRANSISTOR USING THE SAME

CROSS-REFERENCE TO RELATED APPLICATION

This application claims to the benefit pursuant to 35 U.S.C. § 119 (e) (1) of U.S. Provisional applications No. 60/237,730 filed Oct. 5, 2000, and No. 60/254,897 filed Dec. 13, 2000.

TECHNICAL FIELD

The present invention relates to a compound semiconductor multilayer structure comprising a carbon containing p-type GaAs system crystal layer and an n-type group III-V compound semiconductor crystal layer, which can be favorably applied to construct a III-V group compound semiconductor heterojunction bipolar transistor (HBT).

BACKGROUND ART

A heterojunction bipolar transistor (hereinafter, abbreviated as HBT) has been known as a typical example of a group III-V semiconductor device (see "*III-V ZOKU KAGOBUTU HANDOTAI*", authored by Isamu AKAZAKI, Baifukan, published on May 20, 1994, first edition, pp. 239–242). The HBT is a type of semiconductor device (semiconductor element) serving as a signal amplifier for use in a high frequency band such as a microwave band. The HBT is a semiconductor element provided with an NPN-type or a PNP-type heterojunction structure, comprising three functional layers such as an emitter layer for substantially supplying (emitting) an element operating current or electrons, a base layer, and a collector layer for collecting the element operating current ("*HANDOTAI KOGAKU*", edited by Toyoshi FUKAMI, Tokyo Denki Daigaku Shuppan Kyoku, published on Mar. 20, 1993, 1st edition, 7th printing, pp. 97–99). According to the structure of the element, the base layer is interposed between the emitter layer and the collector layer (see the aforementioned "*HANDOTAI KOGAKU*", pp. 97–99).

In an HBT employing a group III-V compound semiconductor, a high carrier (hole) concentration p-type group III-V semiconductor layer is employed as the base layer, which has an important function of regulating element operation current flowing between the emitter and the collector (see the aforementioned "*HANDOTAI KOGAKU*", pp. 239–242). In an NPN-type or a PNP-type HBT employing a compound semiconductor formed of a material system selected from an aluminum gallium arsenide ($Al_xGa_{1-x}As$; $0<x<1$)/gallium arsenide (GaAs)-system and a gallium indium phosphide ($Ga_yIn_{1-y}P$; $0<y<1$)/GaAs-system, a p-type base layer is produced from gallium arsenide. In an NPN-type gallium indium arsenide-system HBT, an n-type $Ga_{0.51}In_{0.49}P$ emitter layer is formed on the front surface of a p-type GaAs base layer and an n-type GaAs collector layer is formed on the rear surface of the p-type GaAs base layer (see IEEE Inc. 21$^{st}$ Annual GaAs IC symposium (Oct. 177-20, 1999), Technical Digest 1999, pp. 237–240).

As a p-type base layer, a crystal layer having low resistance, i.e., a carrier (hole) concentration greater than approximately $1 \times 10^{19}$ cm$^{-3}$, is formed by a vapor growth method such as MOCVD (metal-organic chemical vapor deposition). In vapor growth, a conventional method has been known for vapor growing a p-type GaAs vapor growth layer having a high carrier concentration by doping an acceptor impurity such as zinc (Zn) (see *Electron. Lett.*, 29 (1993), p. 1725). The other conventional method has also been known for vapor growing a p-type GaAs vapor growth having a high carrier concentration by doping carbon (see *Applied Phys. Lett.*, 68 (7) (1996), pp. 982–984). Carbon (C) is generally used for growing the p-type GaAs layer having a high carrier concentration because of ease of producing high hole concentration and because of lower diffusion property than those of group II acceptor impurities (see *J. Vac. Sci. technol.* B, 14 (6) (1996), pp. 3509–3513).

In order to form a carbon-doped p-type GaAs layer through a method such as MOCVD, the following methods can be employed:

(1) a method employing pyrolysis of an organic arsenic compound such as trimethylarsine (($CH_3$)$_3$As) (see Abstract of Fourth European Workshop on Metalorganic Vapor Phase Epitaxy (5–7 Jun. 1991, Nijmegen, The Netherlands), PROGRAM and ABSTRACT, Poster);

(2) a method employing carbon tetrachloride ($CCl_4$), carbon tetrabromide ($CBr_4$), or derivatives thereof serving as carbon sources (see *J. Electron. Mater.*, Vol. 29., No. 2 (2000) pp. 205–209 and *Appl. Phys. Lett.*, 62 (11) (1993) pp. 1248–1250); and (3) a method in which an arsenic (As) source for MOCVD growth of GaAs, such as arsine ($AsH_3$), and agallium (Ga) source such as trimethylgallium (($CH_3$)$_3$Ga) are supplied to a vapor phase reaction system as a As source/Ga source ratio (i.e., V/Ill ratio) that is controlled to a low level (see the aforementioned *J. Electron. Mater.*, Vol. 29, No. 2).

However, conventional HBTs employing a carbon-doped GaAs-system crystal layer having a high carrier (hole) concentration of carbon (C) have been known to have a problem in that element flow current (emitter-collector current) disadvantageously changes over time (see "2000 GaAs MANTECH Conference (May 1–4, 2000)", Digest of Papers (GaAs Mantech, Inc., USA 2000), pp. 131–135). For example, when current drift is generated, the ratio ($\beta$) ($\beta=Ic/Ib$) of the collector current (Ic) to base current (Ib); i.e., current gain (see "*DENSHI DEBAISU KOGAKU*", authored by Seijiro FURUKAWA et al., Morikita Shuppan K. K., published on Oct. 16, 1995, 1st edition, 8th printing, pp. 62–63) becomes unstable disadvantageously.

The present invention has been accomplished on the basis of the finding that the aforementioned current gain and current drift depend on the optical property of the carbon-doped p-type GaAs-system crystal layer and on the concentration of hydrogen serving as an impurity and remaining in the crystal layer. In particular, an object of the present invention is to provide a carbon-doped GaAs crystal layer which effectively reduces current drift in the conventional group III-V compound semiconductor HBTs. Another object of the present invention is to provide group III-V compound semiconductor HBTs which include pn junction structure or semiconductor heterojunction structure of the group III-V semiconductor and a carbon-doped GaAs-system crystal layer.

DISCLOSURE OF THE INVENTION

An object of the present invention is solve the aforementioned problems, and, as a result, the present invention provides compound semiconductor multilayer structures and compound semiconductor HBTs as shown below.

[1] a compound semiconductor multilayer structure provided with carbon-containing p-type GaAs-system crystal layers, wherein the carbon-containing p-type GaAs-system crystal layer exhibits a predetermined photoluminescence peak measured at 20K within the range of 828 nm to 845 nm and that the ratio of hydrogen atom concentration to carbon atom concentration in the crystal layer is 1/5 or less;

[2] a compound semiconductor multilayer structure comprising a carbon-containing p-type GaAs-system crystal layer, wherein in a photoluminescence measurement at 10K, the carbon-containing p-type GaAs-system crystal layer exhibits a first predominant luminescence wavelength and a second predominant luminescence wavelength due to band gap transitions of the GaAs-system crystal layer, and that the second predominant luminescence wavelength has a longer wavelength than that of the first luminescence peak, and that the intensity ratio of the second luminescence peak to the first luminescence peak is within a range from 0.5 to 3.

[3] a compound semiconductor multilayer structure according to any one of claims 1 and 2, wherein the carbon atom concentration of the carbon-containing p-type GaAs-system crystal layer is within a range from $1 \times 10^{19}$ atoms/cm$^3$ to $6 \times 10^{19}$ atoms/cm$^3$.

[4] a compound semiconductor multilayer structure according to any one of claims 1 to 3, wherein the hydrogen atom concentration of the carbon-containing p-type GaAs-system crystal layer is lower than $5 \times 10^{18}$ atoms/cm$^3$.

[5] a compound semiconductor multilayer structure according to any one of claims 1 to 4, wherein the compound semiconductor multilayer structure is constituted by jointing the n-type group III-V compound semiconductor crystal layer with the carbon-containing p-type GaAs-system crystal layer.

[6] a compound semiconductor multilayer structure according to claim 5, wherein the fifth aspect, the n-type group III-V compound semiconductor layer include a region in which a compositional proportion is graded (hereinafter referred to as a composition gradient).

[7] a compound semiconductor multilayer structure according to the claim 6, wherein the n-type group III-V compound semiconductor crystal layer which forms a heterojunction structure with the carbon-containing p-type GaAs-system crystal layer contains a region in which the band gap in the layer is reduced due to the composition gradient from the hetero unction interface between the crystal layers in the direction away from the p-type GaAs-system crystal layer.

[8] a compound semiconductor multilayer structure according to claim 7, wherein the n-type group III-V compound semiconductor crystal layer which forms a heterojunction structure with the carbon-containing p-type GaAs-system crystal layer is a GaxIn$_{1-x}$P ($0 \leq x \leq 1$) layer and contains a region in which the gallium compositional proportion (x) is reduced from the heterojunction interface between the crystal layers in a direction away from the p-type GaAs-system crystal layer.

[9] a group III-V compound semiconductor element is formed by using a compound semiconductor multilayer structure according to any one of claims 1 to 8.

[10] a group III-V compound semiconductor element according to claim 9, wherein the group III-V compound semiconductor element being a heterobipolar transistor.

[11] a compound semiconductor heterobipolar transistor according to claim 10 comprises the carbon-containing p-type GaAs-system crystal layer according to any one of claims 1 to 4 as the base layer and n-type III-V compound semiconductor crystal layer according to any one of claims 5 to 8 as one or both of the emitter layer or the collector layer.

BEST MODE FOR CARRYING OUT THE INVENTION

Figure 1:
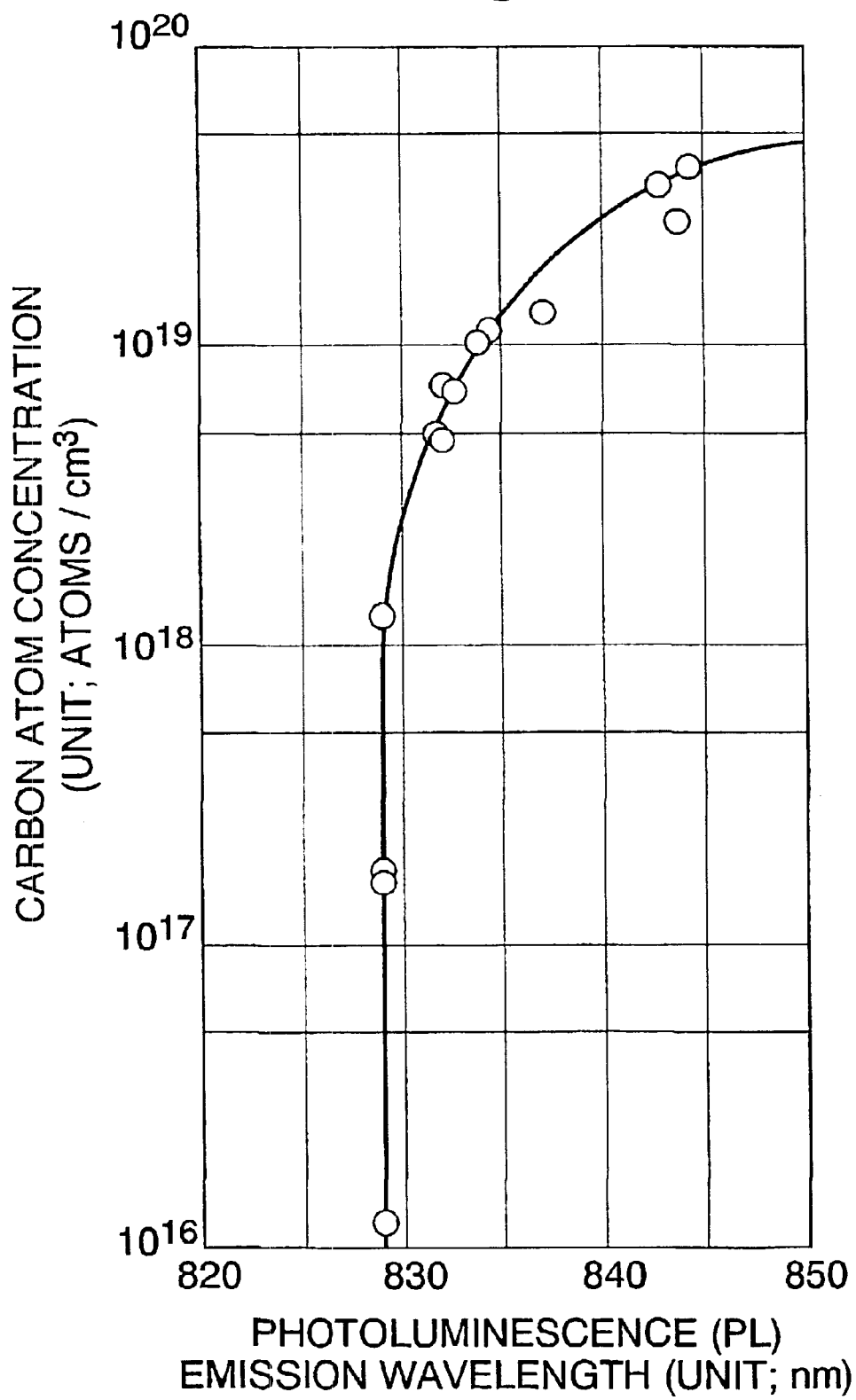
FIG. 1 shows the relationship between the carbon atom concentration and emission wavelength of photoluminescence in a carbon-doped GaAs crystal layer.

According to the first embodiment of the present invention, a carbon-containing p-type GaAs-system crystal layer is deposited on a substrate, such as a single crystal substrate. Single crystals of a group III-V compound semiconductor, such as GaAs or indium phosphate (InP), may be used as the substrate, and single crystals of an element such as silicon (Si) may also be used. The carbon-containing p-type GaAs-system crystal layer is deposited on a surface of the substrate through vapor deposition such as MOCVD. The GaAs-system crystal layer refers to a crystal layer comprising a compound semiconductor, such as GaAs or aluminum gallium arsenide, containing Ga and As serving as constitutional elements. Gallium indium arsenide (Ga$_x$In$_{1-x}$As: $0<x \leq 1$) is a type of the above GaAs compound semiconductor providing the crystal layer. The GaAs-system crystal layer can be formed through vapor phase deposition, such as molecular beam epitaxy (MBE).

The carbon-containing GaAs-system crystal layer can be formed through doping with carbon during film formation of the crystal layer. Examples of employable doping sources include carbon tetrachloride and carbon tetrabromide (see the aforementioned *J. Electron. Mater.*, Vol. 29, (2000) pp. 205 to 209, and *Applied Phys. Lett.*, 62 (11) (1993), pp. 1248 to 1250). Alternatively, the crystal layer may be formed by intrinsic doping means, which employs pyrolysis of an organic arsenic compound such as trimethylarsenic (see the aforementioned Abstract of Fourth European Workshop on Metalorganic Vapor Phase Epitaxy (5–7 Jun. 1991, Nijmegen, The Netherlands), PROGRM).

The carbon atom concentration within the carbon-containing GaAs-system crystal layer is preferably $1 \times 10^{19}$ atoms/cm$^3$ to $6 \times 10^{19}$ atoms/cm$^3$. When doping is carried out by supplying a carbon source such as carbon tetrabromide, one means for controlling the carbon atom concentration is to regulate the amount of source to be supplied. When doping is carried out in an intrinsic doping manner, the carbon atom concentration is controlled by modifying factors such as the film formation temperature and the supply ratio of group V element (arsenic) to group III element (i.e., V/III ratio). The carbon atom concentration in the carbon-containing GaAs-system crystal can be quantitatively determined through analysis such as customarily employed secondary-ion mass spectrometry (SIMS). Generally, the carbon atom concentration changes to a subtle degree between an as-grown state and a post-treated state such as a heat treated state.

In the present invention, the crystallinity of the carbon-containing GaAs-system crystal layer having a carbon atom concentration falling within the aforementioned preferred range must be regulated such that the crystallinity falls within a specific range. Since carbon (atomic radius=0.77 Å) is smaller in atomic radius than gallium (atomic radius=1.38 Å) and arsenic (atomic radius=1.25 Å) (in connection with atomic radius, see "KAGAKU BINRAN KISOHEN" edited by The Chemical Society of Japan, Maruzen K. K., published on Aug. 20, 1970, 3rd printing, p. 1259), excessive incorporation of carbon atoms into the crystal layer causes, for example, shrinkage of the GaAs crystal lattice, thereby deteriorating crystallinity.

Generally, deterioration of crystallinity can be measured through a conventional photoluminescence (PL) method. As crystallinity deteriorates, a drastic drop in PL intensity is observed. FIG. 1 shows the relationship between the carbon atom concentration and emission wavelength of photoluminescence for a carbon-containing GaAs crystal layer of good crystallinity. Excitation was carried out by use of an argon (Ar) laser beam having a wavelength of 488 nm, and PL was measured at 20K. When the carbon atom concentration is about $2 \times 10^{18}$ cm$^{-3}$ or less, PL is observed at approximately 828 nm, which is nearly equivalent to the band gap of GaAs. When the carbon atom concentration increases further, the PL emission wavelength is drastically red-shifted (see FIG. 1).

Among crystal layers having the same carbon atom concentration, those having poor crystallinity exhibit red-shifted PL emission wavelength. In addition, when a carbon-containing GaAs-system crystal layer is grown by MOCVD under inappropriate conditions, crystallinity deteriorates further and the PL emission wavelength tends to red-shifted even though the carbon atom concentration is lower. In a carbon-doped GaAs crystal layer exhibiting PL at a wavelength longer than 845 nm, the wavelength of the PL is lowered considerably. That is, sufficiently favorable crystallinity is difficult to attain for such a carbon-doped GaAs crystal layer.

A carbon-containing GaAs-system crystal layer, which has a preferable carbon atom concentration of $1 \times 10^{19}$ atoms/cm$^3$ to $6 \times 10^{19}$ atoms/cm$^3$ and exhibits PL at 828 nm at 20K, preferably 828 to 840 nm, has favorable crystallinity. Thus, such a crystal layer can be preferably employed as an element such as a p-type base layer contained in HBTs. Among carbon-containing p-type GaAs-system crystal layers of identical carbon atom concentration, those exhibiting PL at a shorter wavelength are more preferably employed to constitutes semiconductor elements. Furthermore, PL measurement at 4.2K, the aforementioned preferred PL emission wavelength falls within the range of approximately 825 nm to 842 nm, inclusive.

In order to produce a carbon-containing Gas-system crystal layer which has a carbon atom concentration falling within a preferred range; i.e., $1 \times 10^{19}$ atoms/cm$^3$ to $6 \times 10^{19}$ atoms/cm$^3$, and which exhibits PL at a wavelength falling within the aforementioned range, firstly, a substrate layer (backing layer) on which a carbon-containing GaAs-system crystal layer is to be deposited is subjected to surface treatment. One preferred surface treatment of the backing layer is a treatment in which the flow rate of arsine (AsH$_3$) gas is modified so as to suppress volatilization of arsenic from the surface of the backing layer maintained at high temperature (film-formation temperature). For example, just before initiation of vapor growth of a carbon-containing GaAs-system crystal layer, supply of arsine gas to the backing layer is intentionally reduced, to thereby cause the composition of the backing layer surface to become deficient in group V elements. Generally, the time for reducing the supply of a volatile group V element is 20 second or less, and preferably 5–15 seconds. When the backing layer is maintained at high temperature, the time is shortened.

Secondly, on the thus-surface-treated backing layer, a carbon-containing GaAs-system crystal layer is formed under rigorously controlled growth conditions. The preferred film formation temperature depends on the pressure of the atmosphere under which film-formation, such as MOCVD, is carried out. In atmospheric pressure MOCVD, the temperature is 500° C. to 600° C., and is preferably 520° C. to 540° C. In reduced pressure MOCVD at about $10^4$ Pa, the temperature is preferably 520° C. to 540° C.

When intrinsic doping is carried out through atmospheric pressure MOCVD using a trimethylgallium (($CH_3$)$_3$Ga/ arsine (AsH$_3$)) reaction system, a V/III ratio of 0.5 to 1.0 is preferred, whereas when the doping is carried out through reduced pressure MOCVD, a V/III ratio of 1.0 to 1.3 is preferred.

Figure 2:
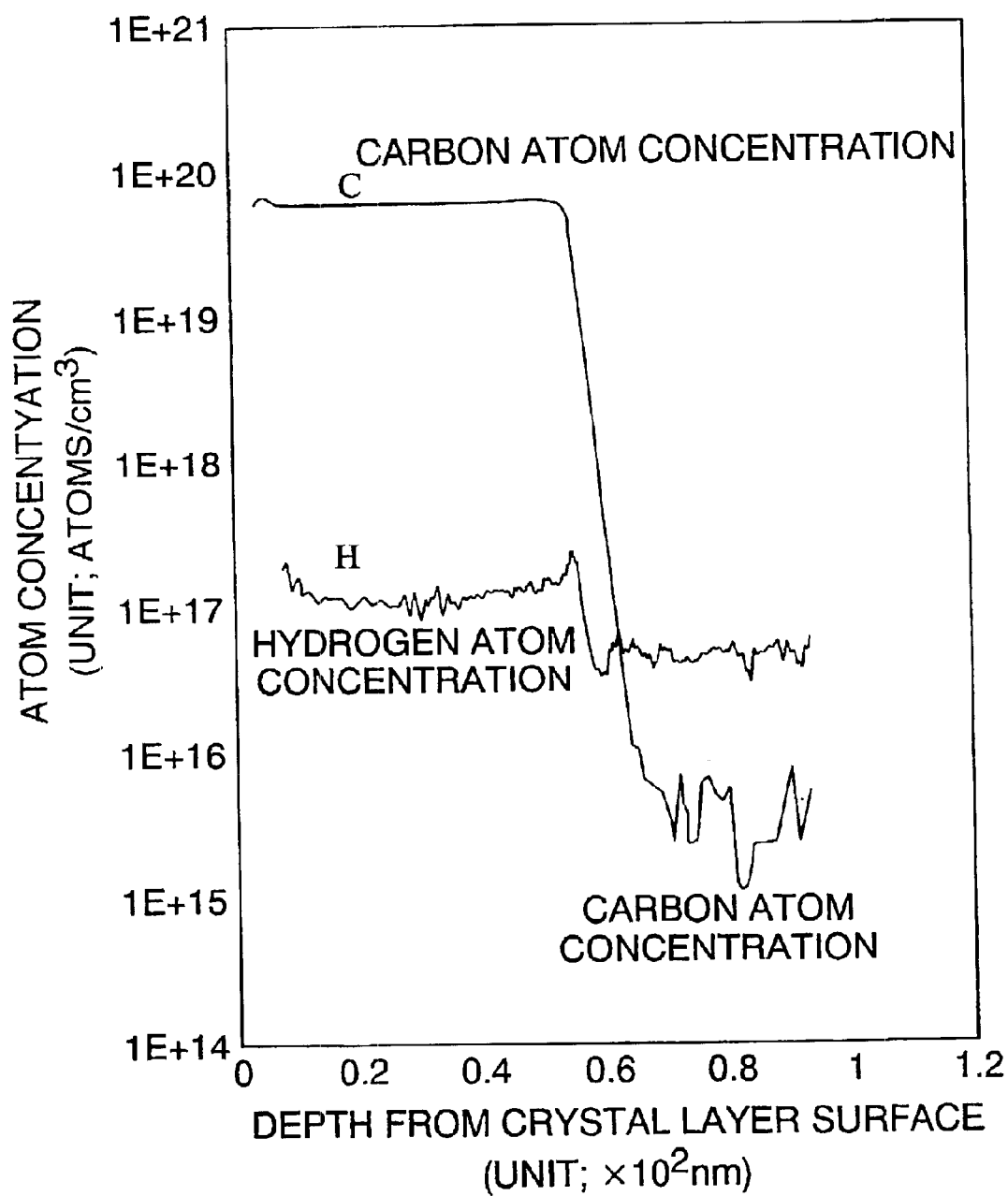
FIG. 2 shows a concentration profile of carbon atoms and that of hydrogen atoms in a depth direction of a carbon-doped p-type GaAs crystal layer.

The hydrogen atom concentration in the carbon-containing GaAs-system crystal layer must be controlled to ⅕ or less of the carbon atom concentration. For example, a p-type GaAs crystal layer has a carbon atom concentration of $2 \times 10^{19}$ atoms/cm$^3$ and a hydrogen atom concentration of $1 \times 10^{18}$ atoms/cm$^3$, which is ¹⁄₁₀ or less of the carbon atom concentration. Although, most preferably, the crystal layer contains no hydrogen atoms, hydrogen is inevitably incorporated into the p-type carbon-containing GaAs system crystal layer from the growth atmosphere during growth thereof. Therefore, in actuality, the minimum hydrogen atom concentration is approximately $1 \times 10^{17}$ atoms/cm$^3$. In practice, when the crystal layer has a hydrogen atom concentration of $1 \times 10^{18}$ atoms/cm$^3$ or less, HBTs exhibiting a β drift, corresponding to the time dependent change in current gain (=β), of less than several % can be fabricated. FIG. 2 shows an example of a concentration profile of carbon atoms and that of hydrogen atoms in a depth direction of a carbon-containing p-type GaAs crystal layer (thickness: approximately 60 nm) for producing GaInP-type HBTs. A base layer formed from a carbon-containing p-type GaAs crystal layer through an intrinsic technique has a carbon atom concentration of $6 \times 10^{19}$ atoms/cm$^3$. The hydrogen atom concentration is reduced to $2 \times 10^{18}$ atoms/cm$^3$, which is ¹⁄₁₀ of the carbon atom concentration. A multilayer structure containing a base layer having such concentration of carbon atoms and hydrogen atoms advantageously provides compound semiconductor HBTs exhibiting stable current gain (β); i.e., variation of β of less than ±1%.

In order to reduce the hydrogen atom concentration in a carbon-containing p-type GaAs-system crystal layer, a technique may be employed, which include vapor growth of a carbon-containing p-type GaAs-system crystal layer, cooling the grown crystal layer, and subsequently subjecting the layer to heat treatment. Through heat treatment at 400° C. or higher for 5 to 10 minutes, the hydrogen atom concentration in the carbon-containing p-type GaAs-system crystal layer can be reduced to a level of about ¹⁄₁₀ of that of the as-grown state. For example, the above heat treatment can reduce an as-grown hydrogen atom concentration of $2.3 \times 10^{19}$ atoms/ cm³ to $2.5 \times 10^{18}$ atoms/cm³. Alternatively, the hydrogen atom concentration in a carbon-containing GaAs-system crystal layer can be effectively reduced through a process including film-forming of a carbon-containing GaAs-system crystal layer; subsequent vapor-growing an n-type group III-V compound semiconductor mixed-crystal layer on the GaAs-system crystal layer to form a heterojunction; and cooling in the vapor growth atmosphere. Since the group III-V compound semiconductor layer, which is brought into contact with the p-type carbon-containing GaAs-system crystal layer, prevents incorporation of hydrogen atoms into the p-type crystal layer from the vapor growth atmosphere during cooling, the hydrogen atom concentration in the p-type GaAs-system crystal layer can be maintained at a low level. Examples of preferred n-type group III-V compound semiconductor crystal layers include an n-type gallium indium phosphide layer. Formation of a heterojunction structure in the aforementioned manner and subsequently cooling makes it possible to form a carbon-containing GaAs-system crystal layer of low hydrogen atom concentration, as well as a pn junction structure required for fabricating compound semiconductor HBTs. Thus, the technique is advantageous.

Figure 3:
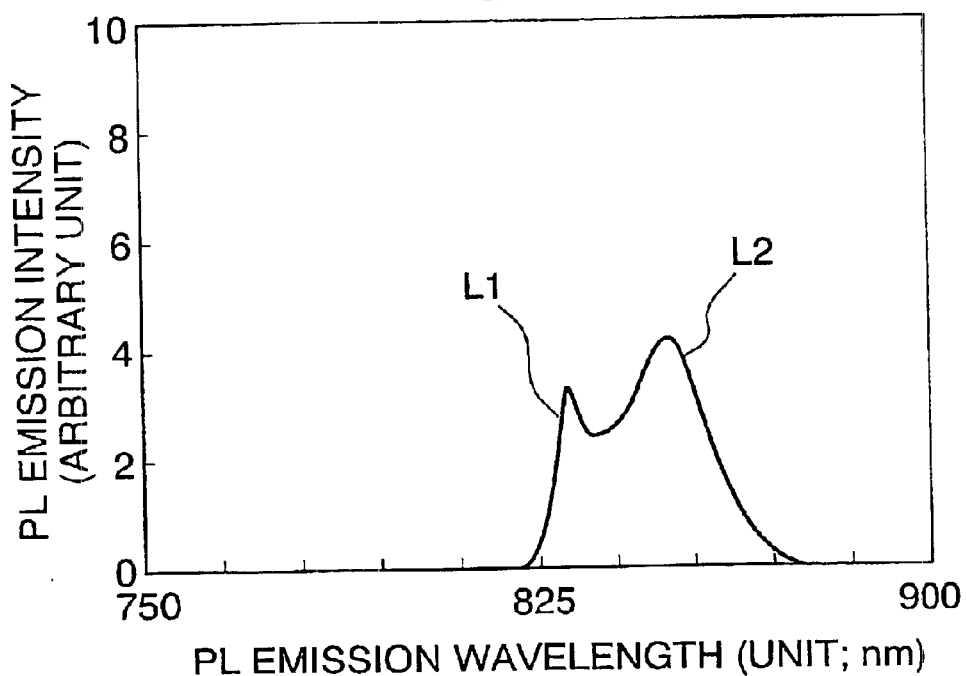
FIG. 3 shows a photoluminescence spectrum of a carbon-doped p-type GaAs layer according to the present invention.

In the second embodiment described in claim 2 of the present invention, the crystallinity of the carbon-containing p-type GaAs crystal layer is a important factor which affects the characteristics of the multilayer structure. FIG. 3 shows a luminescence spectrum of a carbon-containing GaAs crystal layer measured at a temperature of 10K. Excitation was carried out by use of an argon (Ar) laser beam having a wavelength of 488 nm. The first photoluminescence (L1) observed around the peak wavelength of 830 nm is caused by the band gap of GaAs. When the photoluminescence is measured at 10K, the first photoluminescence emission (L1) is observed around the first peak wavelength of approximately 830 nm, and the second photoluminescence emission (L2) is observed at higher wavelength range of approximately 845 nm. The peak wavelength of the second photoluminescence emission (L2) appears at longer wavelength apart from the peak wavelength of the first photoluminescence emission (L1) as the hydrogen atom concentration of a carbon-containing p-type GaAs-system crystal layer is reduced. When the hydrogen atom concentration is $5 \times 10^{18}$ atoms/cm³ or less, the peak wavelength of the second photoluminescence emission is observed at a longer wavelength exceeding 840 nm.

The intensity of the second photoluminescence emission (L2) changes depending upon the carbon atom concentration and the crystallinity of the carbon-containing p-type GaAs-system crystal layer. The intensity of the second photoluminescence emission (L2) tends to increase as the carbon atom concentration increases. When the carbon atom concentration becomes much higher, exceeding the aforementioned preferred range, the GaAs crystal lattice remarkably contracts, which results in obstructing formation of a GaInP-type HBT having a slight time dependent characteristic change. Therefore, the carbon-containing p-type GaAs-system crystal layer exhibiting extremely high emission intensity of the second photoluminescence (L2) is not preferably employed as the base layer for npn junction-type compound semiconductor HBTs. The carbon-containing p-type GaAs-system crystal layers which can be preferably employed as one constituting layer of compound semiconductor HBTs are those where the intensity ratio of the second photoluminescence (L2) to the first photoluminescence (L1) is preferably three times or less.

The emission intensity of the second photoluminescence (L2) is lowered as the crystallinity of the carbon-containing p-type GaAs-system crystal layer deteriorates. When a deteriorated carbon-containing p-type GaAs-system crystal layer containing crystal defects such as transitions or point defects is used as, for example, a base layer, compound semiconductor HBTs having a high current gain cannot be obtained because of the deteriorated hole mobility. In order to exhibit a stable direct current gain ($\beta$) of more than 100, a carbon-containing p-type GaAs-system crystal layer having a superior crystallinity is employed, which exhibits more than 0.5 times of the emission intensity ratio of the second photoluminescence (L2) to the first photoluminescence (L1). It is preferable to use an argon laser light for measurement of the above intensity ratio (L2/L1) at a low temperature (for example, at a temperature of 10K).

In order to obtain a carbon-containing p-type GaAs-system crystal layer which contains a carbon atom concentration within a preferable range of $1 \times 10^{19}$ atoms/cm³ to $6 \times 10^{19}$ atoms/cm³ and which has a preferable intensity ratio of the first and the second photoluminescence, first, the carbon-containing p-type GaAs-system crystal layer must be grown under accurately controlled growth temperature. Although the optimum temperature changes slightly due to by the film-formation pressure, the optimum growth temperature in, for example, MOCVD, ranges from 500° C. to 600° C., and preferably from 520° C. to 560° C. Even when the carbon atom concentration is identical, it is difficult to form a carbon-containing p-type GaAs-system crystal layer having a superior crystallinity if the growth temperature is not in the optimum range. Thus, the emission intensity of the second photoluminescence (L2) is reduced.

Secondly, the compositional ratio of group V/III must be set at a relatively low ratio. When intrinsic doping is carried out through atmospheric pressure MOCVD using a trimethylgallium (($CH_3)_3$Ga/arsine ($AsH_3$)) reaction system, a V/III ratio of 0.5 to 1.0 is preferred, whereas when the doping is carried out through reduced pressure MOCVD, a V/III ratio of 1.0 to 1.3 is preferred. If the V/III ratio is less than 0.5 through the atmospheric pressure, or if the V/Ill ratio is less than 1.0 due to the reduced pressure, a carbon-containing p-type GaAs crystal layer having a smooth surface layer is not obtained in a stable manner. If the V/Ill ratio exceeds 1.0 due to atmospheric pressure and if the V/Ill ratio exceeds 1.3 due to reduced pressure, it becomes difficult to obtain a carbon-containing p-type GaAs-system crystal layer having a hole concentration within a preferred range because the carbon atom concentration in the crystal layer cannot be increased.

It is preferable to carry out the aforementioned first growth temperature control and the second V/Ill ratio control simultaneously.

In the third embodiment described in claim 3 of the present invention, in order to obtain a preferable multilayer structure, the carbon atom concentration in the carbon-containing p-type Gas-system crystal layer must be controlled within a range of $1 \times 10^{19}$ atoms/cm³ to $6 \times 10^{19}$ atoms/cm³.

In the fourth embodiment described in claim 4 of the present invention, in order to form a preferable multilayer structure, it is necessary to use a carbon-containing p-type GaAs-system crystal layer having a hydrogen atom concentration of $5 \times 10^{18}$ atoms/cm³ or less. In order to reduce the time dependent characteristic degradation, a carbon-containing p-type GaAs-system crystal layer having no hydrogen atom concentration is preferable to be employed as the base layer of compound semiconductor HBTs. However, practically, hydrogen atoms penetrate into a carbon-containing p-type GaAs-system crystal layer during growth of the crystal layer from the formation atmosphere. The actual lowest hydrogen atom concentration is in a level of $1\times10^{17}$ atoms/cm$^3$. Practically, when the hydrogen atom concentration is $5\times10^{18}$ atoms/cm$^3$ or less, the time dependent change (β-drift) of the current gain (β) can be suppressed to be several % or less. For example, when a carbon-containing p-type GaAs-system crystal layer having a hydrogen atom concentration of $5\times10^{18}$ atoms/cm$^3$ is employed as a base layer, a component semiconductor HBT having a superior time dependent change of the current gain (β) of less than ±1% is advantageously obtained.

In order to reduce the hydrogen atom concentration in a carbon-containing p-type GaAs-system crystal layer, a technique may be employed, which includes vapor-growing a carbon-containing p-type GaAs-system crystal layer, cooling the grown crystal layer, and subsequently subjecting the layer to heat treatment. By heat treating at temperatures ranging from 400° C. to 850° C. for 5 to 10 minutes, the hydrogen atom concentration in the carbon-containing p-type GaAs-system crystal layer can be reduced to a level of ¹⁄₁₀ of that the as-grown state. For example, the hydrogen atom concentration of $2.3\times10^{19}$ atoms/cm$^3$ at the as grown state can be reduced to a level of $2.5\times10^{18}$ atoms/cm$^3$ by the heat treatment. Alternatively, the hydrogen atom concentration in a carbon-containing p-type GaAs-system crystal layer can be effectively reduced through a process including film-forming a carbon-containing p-type GaAs-system crystal layer; subsequently vapor-growing an n-type group III-V compound semiconductor mixed crystal layer such as gallium indium phosphide ($Ga_xIn_{1-x}P$) layer on the GaAs-system crystal layer to form a heterojunction; and cooling in a vapor growth atmosphere. Since the group III-V compound semiconductor layer, which is brought into contact with the p-type carbon-containing GaAs-system crystal layer, prevents incorporation of hydrogen atoms into the p-type crystal layer from the vapor growth atmosphere during cooling, the hydrogen atom concentration in the p-type GaAs-system crystal layer can be maintained at low level.

By forming a heterojunction structure in the aforementioned manner, and subsequently cooling, a carbon-containing GaAs-system crystal layer having low hydrogen atom concentration, and it is possible to form a pn junction structure which is required for fabricating compound semiconductor HBTs. Thus, this is advantageous.

In the fifth embodiment described in claim 5 of the present invention, the heterojunction structure with the carbon-containing p-type GaAs-system crystal layer is composed of the carbon-containing p-type GaAs crystal layer and an n-type group III-V compound semiconductor layer.

In the sixth embodiment described in claim 6 of the present invention, the junction layer, which forms a heterojunction structure with the carbon-containing p-type GaAs-system crystal layer is formed of an n-type group III-V compound semiconductor layer having a composition graded region.

Composition gradient profiles can be formed by various methods. The n-type group III-V compound semiconductor crystal layer having a composition gradient profile will be described by taking gallium indium phosphide ($Ga_xIn_{1-x}P$) as an example. One example is a profile in $Ga_xIn_{1-x}P$ ($0 \leq x \leq 1$) in which the Ga compositional proportion (=x) is continuously reduced in the thickness direction from the interface. Another example is a profile in which the Ga compositional proportion is fixed in a region near the junction interface between the carbon-containing GaAs-system crystal layer and the group III-V compound semiconductor layer, and subsequently, the Ga compositional proportion is gradually reduced. Still another example is a profile in which the gallium compositional proportion or the indium compositional proportion is changed in a stepwise manner from the junction interface between the carbon-containing p-type GaAs-system crystal layer and the group III-V compound semiconductor layer in a direction away from the p-type GaAs-system crystal layer. In $Ga_xIn_{1-x}P$, when the gallium compositional proportion (=x) increases, the indium compositional proportion (=1-x) automatically decreases.

In the seventh embodiment described in claim 7 of the present invention, an n-type group III-V compound semiconductor mixed crystal layer containing a compositional gradient profile from the junction interface with the carbon-containing p-type GaAs-system crystal layer is employed.

The group III-V compound semiconductor mixed crystal layer having a composition-gradient will be described by taking gallium indium phosphide ($Ga_xIn_{1-x}P$) as an example. In $Ga_xIn_{1-x}P$, the Ga compositional proportions (=x) or the In compositional proportion (=1-x) is gradually changed from the heterojunction interface between the crystal layers in a direction away from the carbon-containing p-type GaAs-system crystal layer. In this case, the compositional gradient profile is formed such that the band gap of the mixed layer is reduced from the junction interface between the carbon-containing GaAs-system crystal layer and the group III-V compound semiconductor layer in a direction away from the p-type GaAs-system crystal layer. Indium phosphide (InP) has a band gap of 1.34 eV, and gallium phosphide (GaP) has a band gap of 2.20 eV, which is greater than that of InP. Taking $Ga_xIn_{1-x}P (0 \leq x \leq 1)$ as an example, the greater the gallium compositional proportion, the greater the band gap. Thus, when the gallium compositional proportion (=x) is gradually reduced from the junction interface between the carbon-containing p-type GaAs-system crystal layer and the group III-V compound semiconductor layer in a direction away from the p-type GaAs-system crystal layer, a composition graded $Ga_xIn_{1-x}P$ layer in which the band gap is gradually reduced in the same direction can be obtained. In aluminum indium arsenide ($Al_zIn_{1-z}As$: $0 \leq z \leq 1$), when a composition gradient in which the aluminum compositional proportion (=z) is gradually reduced from the junction interface between the carbon-containing p-type GaAs-system crystal layer and the group III-V compound semiconductor layer in a direction away from the p-type GaAs crystal layer is employed, a compositional-graded layer in which the band gap is gradually reduced in the same direction can be obtained.

The composition-graded $Ga_xIn_{1-x}P$ layer can be obtained by modifying the amounts of gallium and indium sources supplied to the growth zone as time elapses. Alternatively, the composition-graded layer can be obtained by modifying the amount of one source, e.g., In, supplied to the growth system as time elapses, while the amount of the other source, e.g., Ga is fixed. Another possible means, film-formation temperature is changed as time elapses, so as to employ the difference in decomposition characteristics of the sources, with the ratio of one source to the other source supplied into the growth zone being maintained, to thereby provide a composition gradient. In general, technical means in which the flow of a source supplied into the growth zone is changed as time elapses is preferably employed, in view of controllability to attain a desired composition gradient.

In the eight embodiment described in claim 8 of the present invention, a heterojunction structure formed of a carbon-containing p-type GaAs-system crystal layer and an n-type $Ga_xIn_{1-x}P$ ($0 \leq x \leq 1$) layer is employed, in view that the junction structure exhibits excellent properties, i.e., ease of selective etching of the GaAs crystal and the $Ga_xIn_{1-x}P$ layer and low surface level density.

In the ninth embodiment described in claim 9 of the present invention, the group III-V component semiconductor element is fabricated from a pn-type heterojunction structure formed of a carbon-containing p-type GaAs-system crystal layer and an n-type III-V compound semiconductor layer.

In the tenth embodiment described in claim 10 of the present invention, a compound semiconductor HBT is provided which is constituted of a heterojunction structure formed of a carbon-containing p-type GaAs-system crystal layer and an n-type III-V compound semiconductor layer.

Particularly in the eleventh embodiment described in claim 11 of the present invention, a group III-V component semiconductor HBT is fabricated from a heterojunction structure formed of a carbon-containing p-type GaAs-system crystal layer and a n-type III-V compound semiconductor layer. For example, a $Ga_xIn_{1-x}P$-system compound semiconductor HBT is fabricated from a p-type GaAs-system layer serving as a base layer and an n-type $Ga_xIn_{1-x}P$ composition-graded layer serving as a n emitter layer. Alternatively, from a pn-type heterojunction structure, formed of a p-type $Ga_xIn_{1-x}P$ layer and an n-type $Al_zIn_{1-z}As$ composition-graded layer, there is fabricated an $Al_zIn_{1-z}As$-system compound semiconductor HBT containing a p-type $Ga_xIn_{1-x}P$ layer serving as a base layer and an n-type $Al_zIn_{1-z}As$ serving as an emitter layer. When an n-type group III-V compound semiconductor layer endowed with a composition gradient, such that the band gap reaches its maximum at the pn junction interface, is employed, the band barrier between the base layer and the emitter increases, to thereby prevent current leakage. Thus, HBTs endowed with excellent operation reliability can be effectively provided.

EXAMPLES

Example 1

Figure 4:
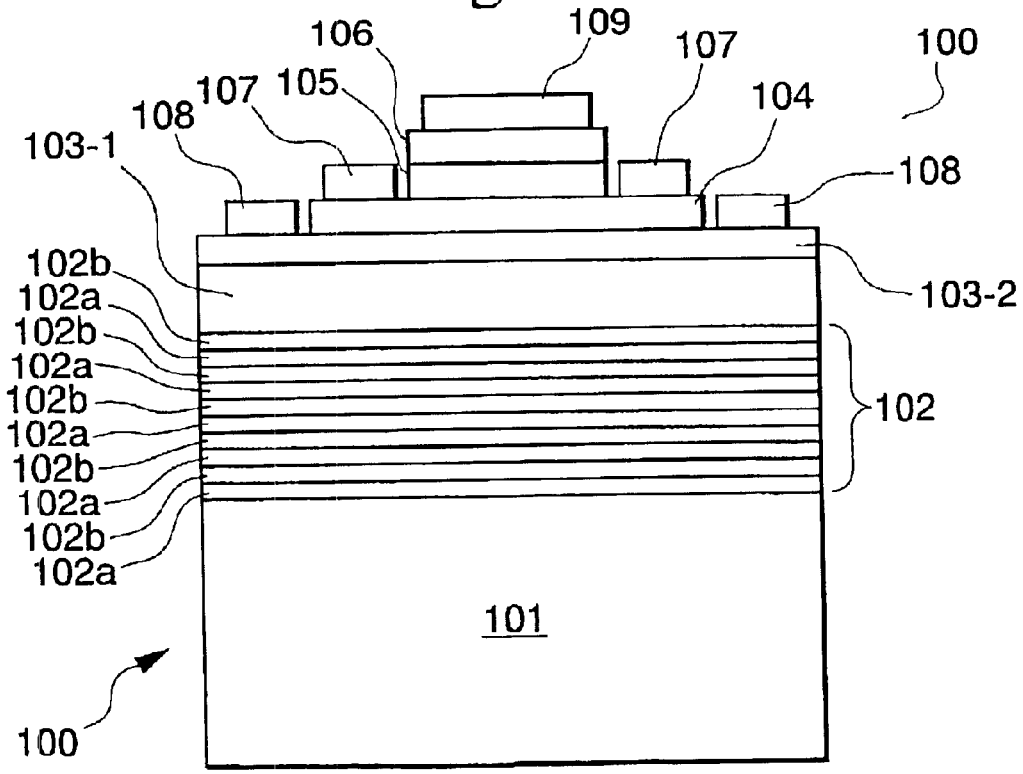
FIG. 4 shows a schematic cross-sectional view of the HBT as described in Example 1.
Figure 5:
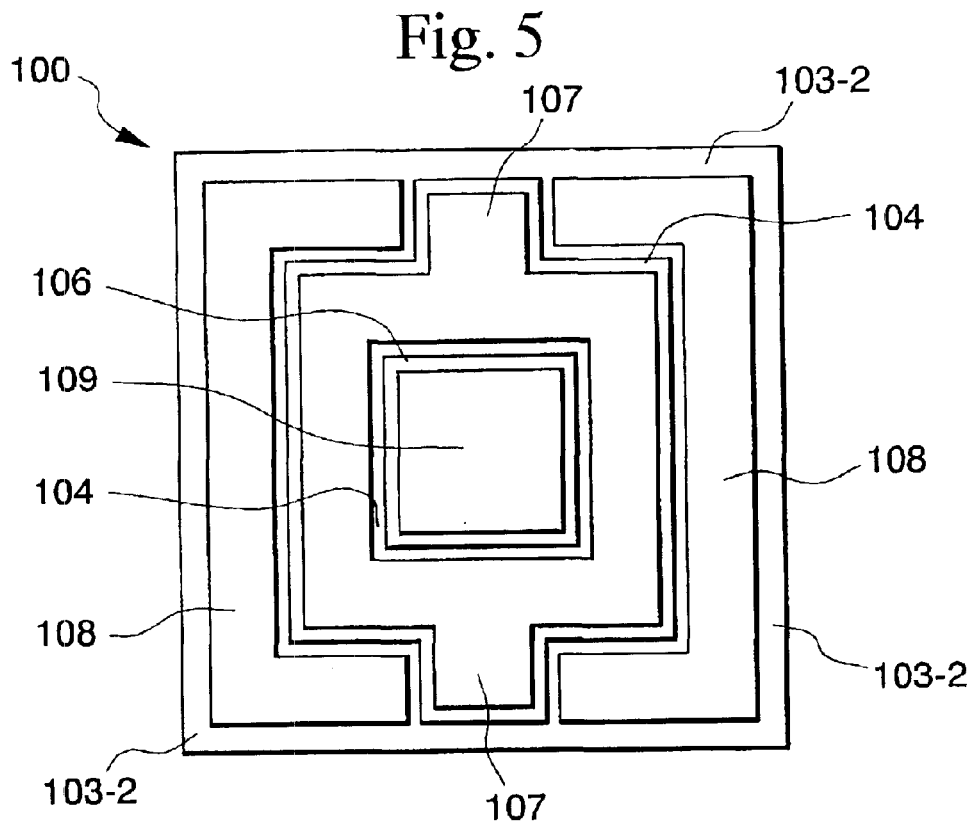
FIG. 5 shows a schematic plan view of a HBT as described in Example 1.

The present invention will next be described in detail with reference to the case in which a $Ga_xIn_{1-x}P$-system HBT is fabricated. FIG. 4 is a schematic cross-sectional view of an HBT 100 according to the present invention.

In an epitaxial multilayer structure for producing the HBT 100, a substrate 101 was formed of an undoped semi-insulating (100) 2° off GaAs single crystal. The GaAs single crystal serving as the substrate had a specific resistance at room temperature of approximately $2 \times 10^8$ Φ·cm. On the upper surface of the substrate 101, which had a diameter of approximately 100 mm, was deposited a superlattice structure of an $Al_cGa_{1-c}As$/GaAs system serving as a buffer layer 102. The superlattice structure was formed of an undoped $Al_{0.3}Ga_{0.7}As$ layer 102a having an aluminum compositional proportion (=c) of 0.30, and an undoped p-type GaAs layer 102b. The undoped $Al_{0.3}Ga_{0.7}As$ layer 102a had a carrier concentration of less than $5 \times 10^{13}$ cm$^{-3}$ and a thickness of 45 nm, while the p-type GaAs layer 102b has a carrier concentration of less than $1 \times 10^{14}$ cm$^{-3}$ and a thickness of 50 nm. Five of each of $Al_{0.3}Ga_{0.7}As$ layer 102a with the above thickness and the p-type GaAs layer 102b with the above thickness were formed alternatingly in the number of five each. Each of the $Al_{0.3}Ga_{0.7}As$ layer 102a and the p-type GaAs layer 102b was formed at 640° C. through reduced pressure MOCVD employing the $(CH_3)_3Ga/(CH_3)_3Al/$ $AsH_3/H_2$ reaction system. The pressure during film formation was approximately $1.3 \times 10^4$ Pa, and hydrogen was employed as a carrier gas.

On the buffer layer 102, an n-type Si-doped GaAs layer was formed as a sub-collector layer 103-1, through reduced-pressure MOCVD employing a $(CH_3)_3Ga/AsH_3/H_2$ reaction system. The GaAs layer serving as the sub-collector 103-1 has a carrier concentrations of $4 \times 10^{18}$ cm$^{-3}$, and the carrier concentration was adjusted by controlling the amount of disilane ($Si_2H_6$) supplied to the MOCVD reaction system. The layer had a thickness of 500 nm. On the sub-collector layer 103-1, an Si-doped GaAs layer was formed as a collector layer 103-2. The collector layer had a carrier concentration of $1 \times 10^{16}$ cm$^{-3}$, and a thickness of 600 nm.

On the n-type GaAs collector layer 103-2, a carbon-doped p-type GaAs layer was formed as a p-type base layer 104 by controlling the ratio of $AsH_3$ to $(CH_3)_3Ga$ (i.e., V/III ratio) supplied to the reaction system to 1.2. The base layer 104 had a carrier concentration of $3 \times 10^{19}$ cm$^{-3}$ and a thickness of 45 nm.

After completion of the growth to form the p-type base layer 104, the growth system was maintained at 640° C. without carrying out the subsequent growth prior to forming the emitter layer 105. During the intermission, the flow of hydrogen ($H_2$) gas, which serves as a carrier gas in the MOCVD reaction system during vapor growth, was maintained. After completion of intermission for precisely five minutes, an n-type $Ga_{0.49}In_{0.51}P$ emitter layer 105 (carrier concentration=$4 \times 10^{17}$ cm$^{-3}$ and a thickness of 30 nm) was formed in a reduced pressure MOCVD system employing the $(CH_3)_3Ga/(CH_3)_3Al/AsH_3/H_2$ reaction system. In addition, a Si-doped n-type $Ga_{0.5}In_{0.5}As$ layer serving as an ohmic contact layer 106 (carrier concentration=$6 \times 10^{18}$ cm$^{-3}$ and a thickness of 60 nm) was deposited on the emitter layer 105, to thereby complete formation of a multilayer structure 1A for producing npn-type HBTs. After completion of vapor growth to form the multilayer structure 1A, the reaction system was filled with nitrogen $N_2$), and the temperature was lowered from 640° C. to 350° C. at 30° C./minute and from 350° C. to room temperature without special cooling. Through the cooling steps, the hydrogen atom (proton) concentration in the carbon-doped GaAs base layer was reduced to $2.0 \times 10^{18}$ atoms/cm$^3$.

Figure 6:
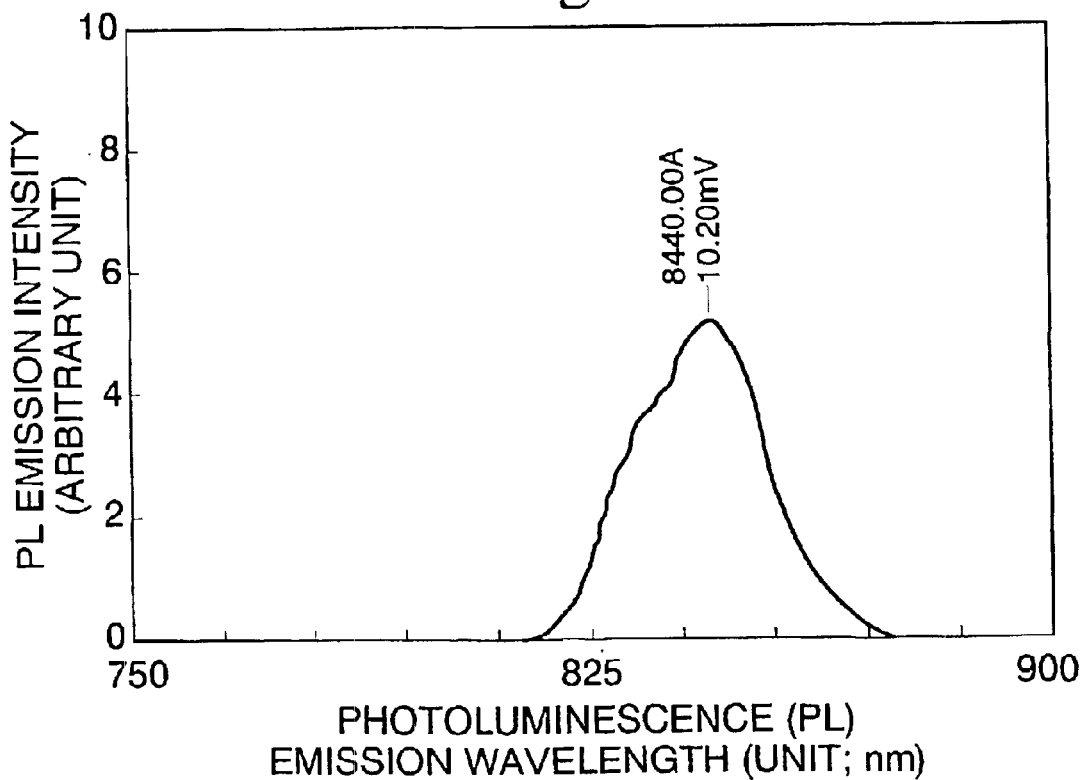
FIG. 6 shows a photoluminescence spectrum at 20K of a carbon-doped p-type GaAs layer according to the present invention.

FIG. 6 shows a PL spectrum of a carbon-doped p-type GaAs layer at 20K. The predominant emission wavelength of PL was 844 nm. Conventional SIMS analysis revealed that the carbon atom concentration in the carbon-doped GaAs base layer 104 was determined to be $4.3 \times 10^{19}$ atoms/cm$^3$.

FIG. 3 shows a PL spectrum of a carbon-doped p-type GaAs layer at 10K. Two predominant emission wavelengths of PL were observed and the first predominant emission wavelength was observed at 830 nm and the second predominant wavelength was observed at 852 nm. The ratio of the intensity of the first predominant wavelength to that of the second predominant wavelength was 1.3. Conventional SIMS analysis revealed that the carbon atom concentration in the carbon-doped p-type GaAs layer 104 was determined to be $4.3 \times 10^{19}$ atoms/cm$^3$.

As shown in FIG. 4, a cross-sectional structure, in which a surface of the p-type base layer 104 and the surface of the n-type collector layer 103-2 are exposed, was formed by wet-etching of the aforementioned multilayer structure. On each exposed surface portion of the base layer 104, a p-type ohmic base electrode 107 made of a gold-zinc alloy was formed. On the exposed surface portion of the collector layer 103, an n-type ohmic collector electrode 108 made of a gold-germanium alloy was formed. On the surface of the remained emitter layer 105, an n-type ohmic emitter electrode made of a gold-germanium alloy was formed. Thus, the npn-type GaInP HBT 100 was fabricated.

The thus-fabricated HBT 100 exhibits a current gain (Ic/Ib:β) of 110 and a β drift as low as 0.5%.

Comparative Example 1

The procedure of Example 1 for producing an npn-type GaInP-system HBT having a structure as shown in FIG. 3 was repeated, except that the following portions were changed, to thereby produce a similar element.

Figure 7:
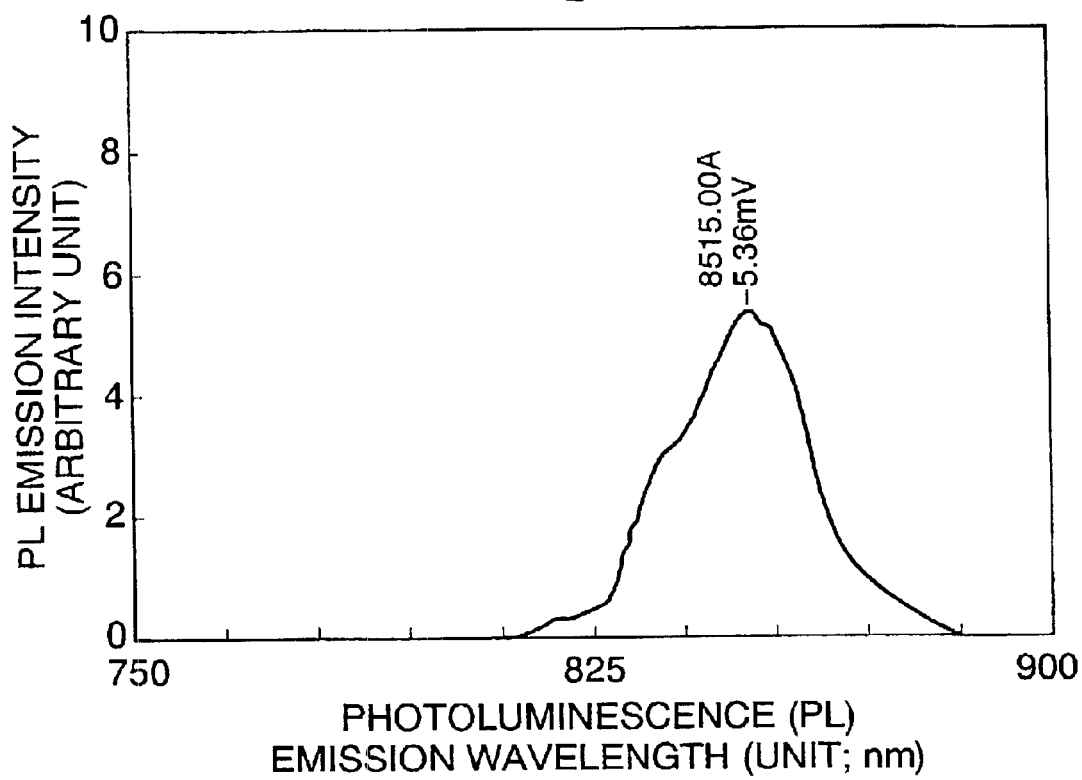
FIG. 7 shows a photoluminescence spectrum at 20K of a conventional carbon-doped p-type GaAs layer as described in Comparative Example 1.

On the GaAs collector layer 103-2 as described in Example 1, a carbon-doped p-type GaAs layer was formed as a p-type base layer 104, by controlling the ratio of $AsH_3$ to $(CH_3)_3Ga$ (i.e., V/III ratio) supplied to the reaction system to 0.9. The carbon-doped p-type GaAs layer serving as the base layer 104 has a carrier concentration of $4\times10^{19}$ cm$^{-3}$ and a thickness of 45 nm, which were similar to those of Example 1. FIG. 7 shows a similar PL spectrum at 20K. The predominant emission wavelength of PL was 852 nm, which was 8 nm longer than the wavelength observed in Example 1. The reason for the red shift of the PL emission wavelength as compared with Example 1 is that the carbon atom concentration was as high as $6.9\times10^{19}$ atoms/cm$^3$. Furthermore, a carrier concentration of approximately the same level was disadvantageous, since the GaAs layer had a hydrogen atom concentration as well as a high carbon atom concentration.

After completion of the growth to form the p-type base layer 104, the growth system was maintained at 640° C. without carrying out the subsequent growth prior to forming the emitter layer 105 identical with that of Example 1. During the intermission, the flow of hydrogen ($H_2$), which serves as a carrier gas in the MOCVD reaction system during vapor growth, was maintained. After completion of intermission for precisely five minutes, the emitter layer 105 and the ohmic contact layer 106 are stacked, to thereby complete formation of a multilayer structure for producing npn-type HBTs. After completion of the growth for producing the multilayer structure, the system was allowed to stand in a hydrogen atmosphere so as to lower the temperature from 640° C. to room temperature. Through the cooling steps, the hydrogen atom concentration in the carbon-doped GaAs base layer 104 was reduced to $2.2\times10^{19}$ atoms/cm$^3$. The difference between the carbon atom concentration and the hydrogen atom concentration in the carbon-doped GaAs base layer 104 was approximately equal to the carrier concentration (=$4\times10^{19}$ atoms/cm$^3$) in the same layer 104.

In a manner similar to that of Example 1, an npn-type GaInP HBT 100 was fabricated from the formed multilayer structure. The HBT 100 exhibited a current gain (Ic/Ib:β) of 50 and a β drift as high as 1.5%.

Comparative Example 2

An npn-type GaInP-system HBT having the same structure as that of Example 1 was formed except that the carbon-containing p-type GaAs layer (base layer) was changed. The same components as those shown in FIG. 4 are denoted by the same reference numbers and their explanations are omitted. The formation of each layer was carried out by the same forming conditions such as forming pressure of $1.3\times10^4$ Pa and a forming temperature of 640° C., except for the temperature for forming the p-type carbon-containing GaAs layer.

On the GaAs layer (base layer) 103-2, a p-type base-layer 104 was deposited by growing a carbon-doped p-type GaAs layer by supplying $AsH_3/(CH_3)_3Ga$ to a reduced pressure MOCVD system at a determined supply ratio (=V/III ratio) of 2.0. The thickness of the carbon-doped p-type GaAs layer as the base layer 104 was 45 nm. The employed growing temperature was 510° C.

After completion of the growth of the p-type GaAs base layer, the npn-type HBT was formed by depositing the emitter layer 105 and the ohmic contact layer 106. After completion of the vapor growth for producing the multilayer structure, the system was allowed to stand in a hydrogen atmosphere so as to lower the temperature from 640° C. to room temperature. After the cooling steps, the carbon-doped GaAs base layer 104 showed a hydrogen atom concentration of $2.2\times10^{19}$ atoms/cm$^3$ and a carbon atom concentration of $4.3\times10^{19}$ atoms/cm$^3$. The difference between the carbon atom concentration and the hydrogen atom concentration in the carbon-doped GaAs base layer 104 was approximately equal to the carrier concentration (=$2\times10^{19}$ cm$^{-3}$) in the same layer 104.

Figure 8:
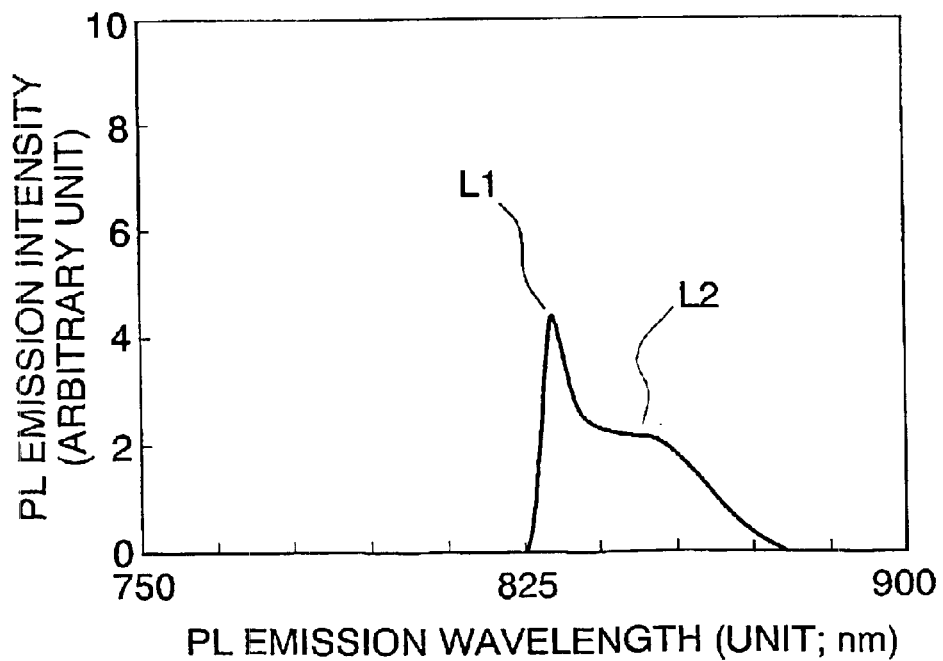
FIG. 8 shows a photoluminescence spectrum at 10K of a carbon-doped p-type GaAs layer as described in Comparative Example 2.

FIG. 8 shows a PL spectrum of a carbon-doped p-type GaAs layer at 10K. In the PL spectrum, a first predominant wavelength (L1) was observed at 831 nm. The second predominant wavelength was observed at 849 nm, which is red-shifted, reflecting a slightly high hydrogen atom concentration in the carbon-doped p-type GaAs layer. In addition, as a result of growing the p-type GaAs layer at a lower temperature than the preferable growth temperature, crystallinity of the carbon-doped p-type GaAs layer was deteriorated, so that the intensity of the second predominant wavelength was reduced to 0.4 times of that of the first predominant wavelength.

In a manner similar to that of Example 1, an npn-type GaInP HBT 100 was fabricated from the formed multilayer structure. The HBT 100 exhibits a current gain (Ic/Ib:β) was as low as 50 and a β drift as high as 1.5%.

Example 2

In example 2, the present invention will be described in detail with reference to the case in which a GaInP-system HBT containing a composition-graded group III-V compound semiconductor layer serving as an emitter layer was fabricated. The formation of each layer was carried out at the same growth pressure of $1.3\times10^4$ Pa and a same growth temperature of 640° C., except for forming the p-type carbon-containing GaAs layer.

After completion of the growth to form the p-type base layer 104, the growth system was maintained at 640° C. without carrying out the subsequent growth prior to forming the emitter layer 105 identical with that of Example 1. During the pause, the flow of hydrogen ($H_2$), which serves as a carrier gas in the MOCVD reaction system during vapor growth, was maintained. After completion of intermission for precisely five minutes, a Si-doped n-type $Ga_xIn_{1-x}P$ ($0\leq x\leq 1$) emitter layer 105 in which gallium composition was graded (carrier concentration=$4\times10^{17}$ cm$^{-3}$ and a thickness of 35 nm) was formed. The gallium composition proportion was adjusted to reach a maximum at the junction interface between the carbon-containing p-type GaAs base layer 104 and the group III-V compound semiconductor layer. The gallium compositional proportion from the junction interface was proportionally reduced to 0.51 to a depth of 7 nm. Thereafter, the gallium compositional proportion was maintained constant at 0.51. In addition, an ohmic contact layer 106 was formed similar to Example 1.

After completion of vapor growth to form a multilayer structure, the reaction system was filled with nitrogen ($N_2$) gas, and the temperature was lowered from 640° C. to 400° C. at 25° C./minute, and from approximately 400° C. to room temperature without special cooling. Through the cooling steps, the hydrogen atom (proton) concentration in the carbon-doped GaAs layer 104 was reduced to $1.8 \times 10^{18}$ atoms/cm$^3$.

In a manner similar to that of Example 1, an npn-type GaInP HBT 100 was fabricated from the formed multilayer structure. The HBT exhibited a current gain (Ic/Ib: β) of 120 and a β drift as low as 0.3%. Furthermore, when 0.1 V is applied between the base electrode 107 and the emitter electrode, the base current was as low as 10 nano ampere.

INDUSTRIAL APPLICABILITY

As described above, the multilayer structure according to the present invention containing a carbon-doped p-type GaAs-system crystal layer which has excellent crystallinity controlled on the basis of the emission wavelength of photoluminescence is capable of producing compound semiconductor HBTs with superior current gains. Particularly, the multilayer structure which includes the carbon-doped p-type GaAs-system crystal layer having a hydrogen atom concentration of less than $5 \times 10^{18}$ atoms/cm$^3$ makes it possible to provide III-V compound semiconductor HBTs endowed with a high current gain and with excellent operation reliability with stable time dependent current gain.

What is claimed is:

1. A compound semiconductor multilayer structure comprising a carbon-containing p-type gallium arsenide (GaAs)-system crystal layer, wherein said carbon-containing p-type GaAs-system crystal layer exhibits a predominant photoluminescence peak measured at 20K within a range of 828 nm to 845 nm, and wherein the ratio of hydrogen atom concentration to carbon atom concentration in said carbon-containing p-type GaAs crystal layer is 1/5 or less.

2. A compound semiconductor multilayer structure according to claim 1, wherein the carbon atom concentration of the carbon-containing p-type GaAs-system crystal layer is within a range from $1 \times 10^{19}$ atoms/cm$^3$ to $6 \times 10^{19}$ atoms/cm$^3$.

3. A compound semiconductor multilayer structure according to claim 1, wherein the hydrogen atom concentration of the carbon-containing p-type GaAs-system crystal layer is lower than $5 \times 10^{18}$ atoms/cm$^3$.

4. A compound semiconductor multilayer structure according to claim 1, wherein the compound semiconductor junction structure is constituted by joining a n-type group III-V compound semiconductor crystal layer with the carbon-containing p-type GaAs-system crystal layer.

5. A compound semiconductor multilayer structure according to claim 4, wherein the n-type group III-V compound semiconductor layer includes a region in which a compositional proportion is graded.

6. A compound semiconductor multilayer structure according to claim 5, wherein the n-type group III-V compound semiconductor crystal layer which forms a heterojunction structure with the carbon-containing p-type GaAs-system crystal layer contains a region in which the band gap in the layer is reduced due to the composition gradient from the heterojunction interface between the crystal layers in the direction away from the p-type GaAs-system crystal layer.

7. A compound semiconductor multilayer structure according to claim 6, wherein the n-type group III-V compound semiconductor crystal layer which forms a heterojunction structure with the carbon-containing p-type GaAs-system crystal layer is a Ga$_x$In$_{1-x}$P ($0 \leq x \leq 1$) layer and contains a region in which the gallium compositional proportion (x) is reduced from the heterojunction interface between the crystal layers in a direction away from the p-type GaAs-system crystal layer.

8. A group III-V compound semiconductor element which is formed by using a compound semiconductor multilayer structure or heterojunction structure according to claim 1.

9. A group III-V compound semiconductor element according to claim 8, wherein the group III-V compound semiconductor element is a heterobipolar transistor.

10. A compound semiconductor multilayer structure according to claim 1, wherein the carbon-containing p-type GaAs-system layer is formed by intrinsic doping through atmospheric pressure MOCVD in which a V/III ratio is in a range from 0.5 to 1.0, or through reduced pressure MOCVD in which a V/III ratio is in a range from 1.0 to 1.3.

11. A compound semiconductor multilayer structure comprising a carbon-containing p-type GaAs-system crystal layer, wherein, in a photoluminescence measurement at 10K, said carbon-containing GaAs-system p-type crystal layer exhibits a first predominant photoluminescence peak and a second predominant photoluminescence peak due to band gap transitions of GaAs and wherein said second predominant luminescence wavelength has a longer wavelength than said first predominant photoluminescence wavelength and the intensity ratio of the second luminescence peak to the first luminescence peak is within a range from 0.5 to 3.

12. A compound semiconductor multilayer structure according to claim 11, wherein the carbon atom concentration of the carbon-containing p-type GaAs-system crystal layer is within a range from $1 \times 10^{19}$ atoms/cm$^3$ to $6 \times 10^{19}$ atoms/cm$^3$.

13. A compound semiconductor multilayer structure according to claim 11, wherein the hydrogen atom concentration of the carbon-containing p-type GaAs-system crystal layer is lower than $5 \times 10^{18}$ atoms/cm$^3$.

14. A compound semiconductor multilayer structure according to claim 11, wherein the compound semiconductor junction structure is constituted by joining a n-type group III-V compound semiconductor crystal layer with the carbon-containing p-type GaAs-system crystal layer.

15. A compound semiconductor multilayer structure according to claim 14, wherein the n-type group III-V compound semiconductor layer includes a region in which a compositional proportion is graded.

16. A compound semiconductor multilayer structure according to claim 15, wherein the n-type group III-V compound semiconductor crystal layer which forms a heterojunction structure with the carbon-containing p-type GaAs-system crystal layer contains a region in which the band gap in the layer is reduced due to the composition gradient from the heterojunction interface between the crystal layers in the direction away from the p-type GaAs-system crystal layer.

17. A compound semiconductor multilayer structure according to claim 16, wherein the n-type group III-V compound semiconductor crystal layer which forms a heterojunction structure with the carbon-containing p-type GaAs-system crystal layer is a Ga$_x$In$_{1-x}$P ($0 \leq x \leq 1$) layer and contains a region in which the gallium compositional proportion (x) is reduced from the heterojunction interface between the crystal layers in a direction away from the p-type GaAs-system crystal layer.

18. A group III-V compound semiconductor element which is formed by using a compound semiconductor multilayer structure or heterojunction structure according to claim 11.

19. A group III-V compound semiconductor element according to claim 18, wherein the group III-V compound semiconductor element is a heterobipolar transistor.

20. A compound semiconductor multilayer structure according to claim 11, wherein the carbon-containing p-type GaAs-system layer is formed by intrinsic doping through atmospheric pressure MOCVD in which a V/III ratio is in a range from 0.5 to 1.0, or through reduced pressure MOCVD in which a V/III ratio is in a range from 1.0 to 1.3.

21. A compound semiconductor heterobipolar transistor comprising a compound semiconductor junction structure including a carbon-containing p-type GaAs-system crystal layer as a base layer and a n-type III-V compound semiconductor crystal layer joined to the base layer as one or both of an emitter layer or a collector layer, said carbon-containing p-type GaAs-system crystal layer exhibiting a predominant photoluminescence peak measured at 20K within a range of 828 nm to 845 nm, wherein the ratio of hydrogen atom concentration to carbon atom concentration in said carbon-containing p-type GaAs crystal layer is 1/5 or less.

22. A compound semiconductor heterobipolar transistor comprising a compound semiconductor junction structure including a carbon-containing p-type GaAs-system crystal layer as a base layer and a n-type III-V compound semiconductor crystal layer joined to the base layer as one or both of an emitter layer or a collector layer, wherein, in a photoluminescence measurement at 10K, said carbon-containing GaAs-system p-type crystal layer exhibits a first predominant photoluminescence peak and a second predominant photoluminescence peak due to band gap transitions of GaAs and wherein said second predominant luminescence wavelength has a longer wavelength than said first predominant photoluminescence wavelength and the intensity ratio of the second luminescence peak to the first luminescence peak is within a range from 0.5 to 3.

* * * * *